United States Patent
Cai et al.

(10) Patent No.: US 8,732,561 B2
(45) Date of Patent: May 20, 2014

(54) SYSTEM AND METHOD FOR FORWARD ERROR CORRECTION DECODING USING SOFT INFORMATION

(75) Inventors: Yi Cai, Eatontown, NJ (US); Jin-Xing Cai, Morganville, NJ (US); Morten Nissov, Ocean, NJ (US)

(73) Assignee: Tyco Electronics Subsea Communications LLC, Eatontown, NJ (US)

( * ) Notice: Subject to any disclaimer, the term of this patent is extended or adjusted under 35 U.S.C. 154(b) by 1506 days.

(21) Appl. No.: 11/937,706

(22) Filed: Nov. 9, 2007

(65) Prior Publication Data

US 2008/0059868 A1     Mar. 6, 2008

Related U.S. Application Data

(62) Division of application No. 11/018,056, filed on Dec. 21, 2004, now Pat. No. 7,398,454.

(51) Int. Cl.
    *H03M 13/00*     (2006.01)

(52) U.S. Cl.
    USPC .......................................... 714/780; 714/776

(58) Field of Classification Search
    USPC ................................. 714/780, 776
    See application file for complete search history.

(56) References Cited

U.S. PATENT DOCUMENTS

| | | | |
|---|---|---|---|
| 4,577,333 A | | 3/1986 | Lewis et al. |
| 4,742,533 A | * | 5/1988 | Weidner et al. ............... 375/331 |
| 5,444,736 A | * | 8/1995 | Kawashima et al. ......... 375/219 |
| 5,550,868 A | * | 8/1996 | Boccuzzi ...................... 375/330 |
| 5,594,758 A | * | 1/1997 | Petranovich .................. 375/344 |
| 5,610,949 A | * | 3/1997 | Petranovich .................. 375/330 |
| 5,625,652 A | * | 4/1997 | Petranovich .................. 375/355 |
| 5,706,313 A | * | 1/1998 | Blasiak et al. ................ 375/330 |
| 5,768,291 A | * | 6/1998 | Kelton et al. ................. 714/746 |
| 5,815,099 A | * | 9/1998 | Gledhill et al. ................. 341/94 |
| 5,822,704 A | * | 10/1998 | Ishii .......................... 455/553.1 |
| 6,029,264 A | * | 2/2000 | Kobayashi et al. ........... 714/755 |
| 6,127,884 A | * | 10/2000 | Rishi ............................ 329/304 |
| 6,320,920 B1 | * | 11/2001 | Beyke .......................... 375/350 |
| 6,426,978 B1 | * | 7/2002 | Bottomley et al. ........... 375/265 |

(Continued)

FOREIGN PATENT DOCUMENTS

| | | |
|---|---|---|
| EP | 0174612 A2 | 3/1986 |
| EP | 1383254 A1 | 1/2004 |
| EP | 1427158 A1 | 6/2004 |
| JP | 2002-247120 A | 3/2002 |
| JP | 2002-094484 A | 8/2002 |

OTHER PUBLICATIONS

Mizuochi et al: Forward Error Correction Based on Block Turbo Code With 3-Bit Soft Decision for 10-Gb/s Optical Communication Systems:, IEEE Journal of Selected Topics in Quantum Electronics, IEEE Service Center, Piscataway, NJ, US, vol. 10, No. 2, Mar. 1, 2004, pp. 376-386.

(Continued)

*Primary Examiner* — Joseph D Torres

(57) ABSTRACT

A system and method for soft decision forward error correction (FEC) decoding may be used to determine a possible error in a differential detection signal, for example, in a DPSK system. The system and method uses the constructive and destructive signals from a demodulator to provide an error locating signal. Using the error locating signal, the system and method converts the differential detection signal into a soft decision signal including multi-level soft values.

8 Claims, 3 Drawing Sheets

(56) References Cited

U.S. PATENT DOCUMENTS

| | | | |
|---|---|---|---|
| 6,466,632 B1 * | 10/2002 | Igarashi et al. | 375/347 |
| 6,522,436 B2 * | 2/2003 | Roberts et al. | 398/27 |
| 7,076,169 B2 * | 7/2006 | Shpantzer et al. | 398/76 |
| 7,103,107 B2 * | 9/2006 | Matsunaga et al. | 375/262 |
| 7,398,454 B2 | 7/2008 | Cai et al. | |
| 7,616,703 B2 * | 11/2009 | Bauch | 375/299 |
| 7,649,953 B2 * | 1/2010 | Bauch | 375/267 |

OTHER PUBLICATIONS

Yadin Y et al: "Soft Detection of Multichip DPSK Over the Nonlinear Fiber-Optic Channel", IEEE Photonics Technology Letters, IEEE Service Center, Piscataway, NJ, US, vol. 17, No. 9, Sep. 1, 2005, pp. 2001-2003.

European Search Report issued in corresponding patent application EP 05257898 on Apr. 13, 2012.

* cited by examiner

| DIFF. DETECTOR OUTPUT | ... | 1 | -1 | -1 | 1 | 1 | -1 | ... |
|---|---|---|---|---|---|---|---|---|
| INV. XOR OUTPUT | ... | 0 | 0 | 1 | 0 | 0 | 0 | ... |
| MAPPING TABLE SELECTED | ... | 1 | 1 | 2 | 1 | 1 | 1 | ... |
| 4 LEVEL SOFT SIGNAL | ... | 3 | 0 | 1 | 3 | 3 | 0 | ... |

| DIFF. DETECTOR OUTPUT | .. | 1 | -1 | 1 | 1 | -1 | .. |
|---|---|---|---|---|---|---|---|
| INV. XOR OUTPUT | .. | 0 | 0 | 0 | 1 | 0 | .. |
| SOFT SIGNAL | .. | 1 | -1 | 1 | E | -1 | .. |

SYSTEM AND METHOD FOR FORWARD ERROR CORRECTION DECODING USING SOFT INFORMATION

CROSS-REFERENCE TO RELATED APPLICATIONS

This application is a divisional of U.S. patent application Ser. No. 11/018,056, filed Dec. 21, 2004, the teachings of which are hereby incorporated herein by reference.

TECHNICAL FIELD

The present application relates to error correction of digital signals and, more particularly, to a system and method for forward error correction decoding using soft information.

BACKGROUND

In optical communications systems, an optical signal may be modulated with digital data in order to transmit the data over an optical transmission path. Different parameters of the optical signal may be varied to represent digital data (e.g., the binary digits "0" and "1"). According to one type of modulation, known as differential phase shift keying (DPSK), the binary digits are indicated by differential phase transitions in the optical signal. For example, a phase change in the optical signal may indicate a "0" and no phase change in the optical signal may indicate a "1".

One problem associated with optical communication systems is maintaining the integrity of the data being communicated, particularly when optical signals are transmitted over long distances in long-haul communication systems. Accumulated noise contributed by many different sources in a transmission path may cause degradation of the signals and may cause difficulty in differentiating between the binary digits (i.e., the ones and zeros) in a data stream.

Forward Error Correction (FEC) is a technique used to help compensate for this degradation. FEC is essentially the incorporation of a suitable code into a data stream at the transmitter. The code is used by the system's receiver for the detection and correction of data errors. The transmitter receives a data stream and encodes the data stream using an FEC encoder that introduces some redundancy in the binary information sequence of the data stream. The receiver receives the encoded data and runs it through an FEC decoder to detect and correct errors.

Two types of decoding have been used to recover the information bits in the receiver, hard and soft decision decoding. According to hard decision decoding, received samples are compared at the output of the demodulator to an optimal threshold and hard decisions are taken and fed to the decoder where the errors are corrected. For example, a bit is "1" if the signal level exceeds a predetermined level and a bit is "0" if the signal level falls below the predetermined level. According to soft decision decoding, the received samples may be quantized in a multiple bit word and then fed to the decoder. The multiple bits provide "soft" information representing a confidence level in the received data, which may be used to perform more reliable decoding than in the case of hard decision decoding.

Although hard decision decoding has been used to provide some error correction in DPSK systems, existing DPSK systems using hard-decision detection may still experience an unacceptably high number of bit errors at some low signal to noise ratio. The system performance can be improved by employing a system and method of forward error correction decoding using soft information that is capable of improving the detection and correction of bit errors in digital signals, particularly in a DPSK system or similar system.

BRIEF DESCRIPTION OF THE DRAWINGS

Reference should be made to the following detailed description which should be read in conjunction with the following figures, wherein like numerals represent like parts.

DETAILED DESCRIPTION

Figure 1:
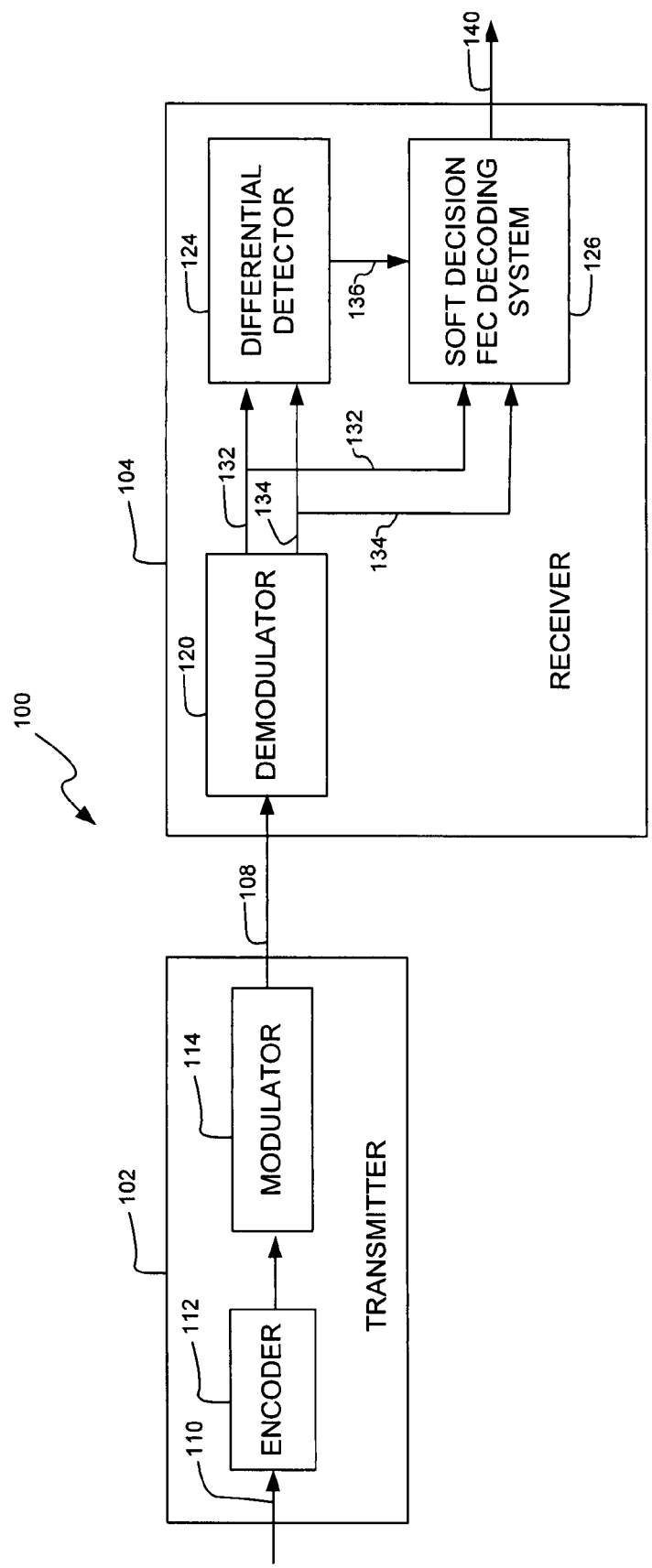
FIG. 1 is a schematic block diagram of an optical communication system using forward error correction with soft information, consistent with one embodiment of the present invention.

FIG. 1 shows an optical communication system 100 using forward error correction (FEC) with soft decision decoding, consistent with one embodiment of the present invention. The optical communication system 100 may include a transmitter 102 for transmitting a modulated FEC encoded optical signal 108 and a receiver 104 for receiving the modulated FEC encoded optical signal 108 and providing an output 140. Those of ordinary skill in the art will recognize that the depicted system is highly simplified for ease of explanation. For example, the transmitter 102 and the receiver 104 may be configured as one or more transceivers capable of performing both transmitting and receiving functions. The illustrated embodiments herein are provided only by way of explanation, not of limitation.

The transmitter 102 may include an encoder 112 that encodes a data stream 110 with error correction data and a modulator 114 that modulates an optical signal with the encoded data stream. The encoder 112 may use FEC schemes known to those skilled in the art, such as a turbo product code (TPC) scheme. The modulator 114 may use a modulation technique that represents binary data using differential phase transitions in the modulated optical signal, such as differential phase shift keying (DPSK) techniques.

The receiver 104 includes a demodulator 120, a differential detector 124, and a soft decision FEC decoding system 126. The demodulator 120 demodulates the modulated FEC encoded optical signal 108 (e.g., using DPSK demodulation) and produces a constructive signal 132 and destructive signal 134. The demodulator 120 may be a DPSK demodulator based on an optical delay interferometer, such as a Mach-Zehnder interferometer. An optical delay interferometer may be used to split the optical signal 108, create a delay in one of the split signals, and recombine the split signals to form the constructive and destructive signals 132, 134 based on constructive and destructive interference between the split signals. Such demodulation techniques are generally known to those skilled in the art. The information bits in the constructive signal 132 and the destructive signal 134 are generally inverted with respect to each other.

Although the embodiments described herein use FEC with soft decision decoding in a differential phase shift keying (DPSK) system, those skilled in the art will recognize that the error correction concepts described herein may be used in other systems using other types of modulation and demodulation. In general, the FEC decoding system and method described herein may be used in any system using a demodulation technique in which two signal streams (e.g., the constructive and destructive signals) appear to have inverted information bits. Other such demodulation techniques include, but are not limited to, differential quaternary phase shift keying (DQPSK) modulation.

The differential detector 124 receives the constructive and destructive signals 132, 134 and produces a differential detection signal 136 corresponding to the encoded data stream. The differential detector 124 may be implemented as a balanced receiver including optical/electrical converters (e.g., photodiodes) for converting the constructive and destructive signals 132, 134 to electrical signals and a differential amplifier for performing a subtraction of the electrical signals to produce the differential detection signal 136. The differential detection signal 136 may include binary values (e.g., "1" and "−1") based on hard-decision detection.

The term "binary", as used herein, means capable of having only two possible values (e.g., "0" and "1", or "−1" and "1"). The term "hard decision" as used herein refers to a detection decision (e.g., with respect to a binary value) made based on an absolute threshold. As one example not necessarily representative of a specific embodiment, a signal magnitude greater than or equal to one volt may always be detected as a binary value of "1" and a signal with a magnitude less than or equal to one volt may always be detected as a binary value of "0."

The FEC decoding system 126 receives the constructive and destructive signals 132, 134 and the differential detection signal 136 and uses the inversion nature of the constructive and destructive signals 132, 134 to adjust the differential detection signal 136 to multi-level values containing soft information. The FEC decoding system 126 may adjust the differential detection signal 136 by substituting one or more of the binary hard-decision values in the differential detection signal 136 with one or more multi-level soft values. As used herein, "soft value" refers to a value representing a likelihood or confidence level with respect to a binary value. The soft values to be substituted are selected based on the location of possible errors detected using the constructive and destructive signals 132, 134, as will be described in greater detail below. The adjusted differential detection signal with the soft values may then be decoded using soft decision FEC decoding techniques known to those skilled in the art to improve system performance.

Figures 2, 3:
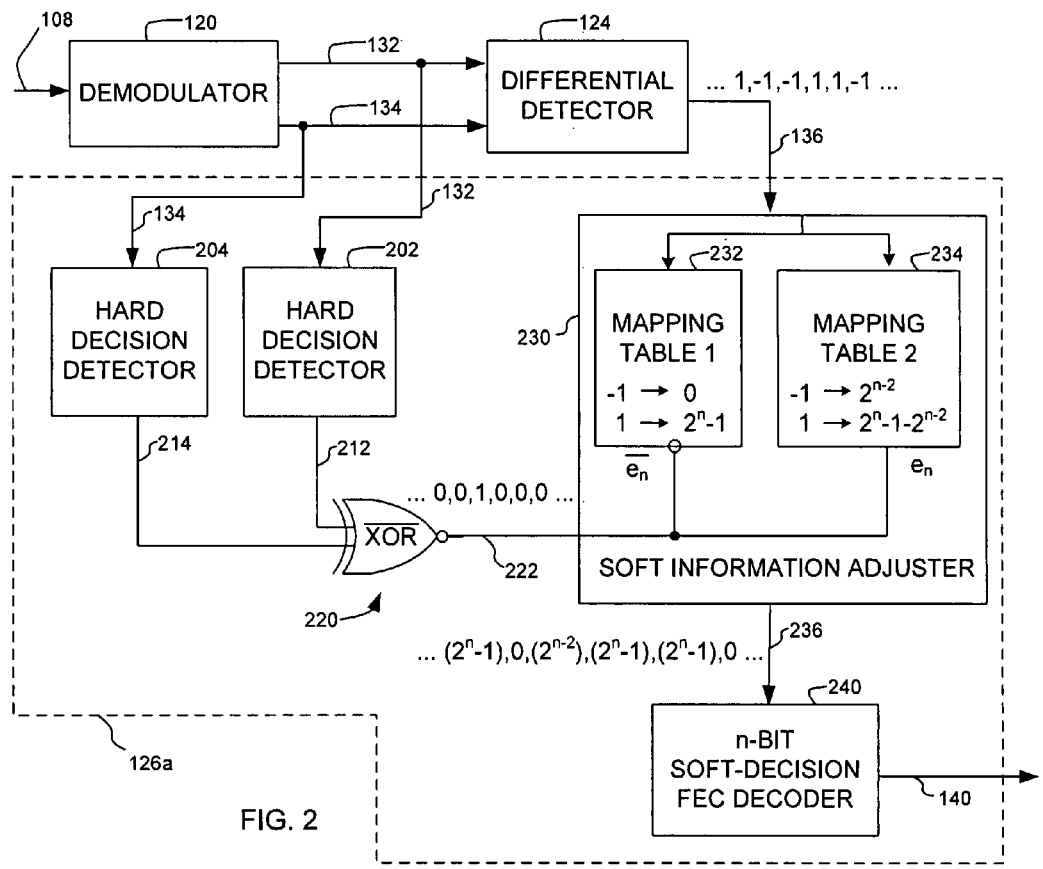
FIG. 2 is a schematic block diagram of one embodiment of a soft information FEC decoding system using mapping tables.
FIG. 3 is a table illustrating one example of the values of a differential detection signal and the corresponding values of an error locating signal and soft decision signal.

FIG. 2 shows one embodiment of the soft information FEC decoding system 126a capable of $2^n$ decision level soft decoding. The FEC decoding system 126a may include hard-decision detectors 202, 204 that receive the constructive signal 132 and the destructive signal 134. The hard-decision detectors 202, 204 convert the signals 132, 134 into electrical signals, detect the bit values in the electrical signal using hard-decision techniques, and produce binary signals 212, 214 corresponding to the constructive and destructive signals 132, 134, respectfully. The resulting binary signals 212, 214 may then be compared using a logic circuit 220 to produce an error locating signal 222, which indicates possible errors in the differential detection signal 136 corresponding to the encoded data stream.

If the modulated optical signal 108 is a noise-free DPSK signal, for example, the hard-decision detected binary signals 212, 214 corresponding to the constructive and destructive signals 132, 134 should always be inverted towards each other. When the binary signals 212, 214 are fed into an inverted exclusive OR logic circuit 220 and bits are inverted with respect to each other, the output of the inverted exclusive OR logic circuit 220 should be "0". In the case of a noisy DPSK signal, one or more of the bits in the binary signals 212, 214 may not be inverted toward each other. When the binary signals 212, 214 are fed through an inverted exclusive OR logic circuit 220 and bits are not inverted toward each other, the output of the inverted exclusive OR logic circuit 220 should be "1" indicating a possible detection error. Because the "1" in the error locating signal 222 corresponds to a bit in the differential detection signal 136, the error locating signal 222 may be used to locate a possible error in the differential detection signal 136. Although an inverted exclusive OR logic circuit is used in the illustrated embodiment, the soft information FEC decoding system 126 may use other types of circuitry to provide an error locating signal indicating a possible detection error.

The FEC decoding system 126a may also include a soft information adjuster 230 that adjusts the differential detection signal 136 using soft values. As mentioned above, the differential detection signal 136 may be a binary signal including values (e.g., "1" or "−1") determined using hard decision detection. The soft information adjuster 230 may include mapping tables 232, 234 for mapping the hard decision values in the differential detection signal 136 to multi-level soft values. The multi-level soft values represent a level of confidence in each bit of the detected signal. The error locating signal 222 output from the logic circuit 220 may be used as an enable signal to select one of the mapping tables 232, 234 depending upon the possibility of an error as indicated by the error locating signal 222. For example, when the output of the logic circuit 220 (i.e., the error locating signal 222) is "0" and there is confidence in the differential detection, a first mapping table 232 may be selected. On the other hand, when the output of the logic circuit 220 is "1" and there is a possible error in the differential detection, a second mapping table 234 may be selected. Those of ordinary skill in the art will recognize that the soft information adjuster 230 and the first and second mapping tables 232, 234 may be implemented using, for example, circuitry, preprogrammed memory, user-programmable memory, or software.

Using the mapping tables, the soft decision adjuster 230 produces a soft decision signal 236 corresponding to the differential detection signal 136. The soft decision signal 236 is produced by substituting the mapped soft values for the hard decision detected values in the differential detection signal 136. The soft decision signal 236 may be decoded using a soft decision decoder 240, such as an n-bit soft decision FEC decoder, using decoding techniques known to those skilled in the art, such as TPC decoding.

Mapping of the binary values in the differential detection signal 136 to the soft values may relate to the number of bits, n, that may be decoded by the n-bit soft-decision FEC decoder 240. For an n-bit soft-decision FEC decoder 240, for example, the possible soft decision input values are 0, 1, 2, ... $2^n-1$. Where the differential detection signal has only two possible values (e.g., "1" and "−1"), these values may be mapped to the soft values $\{0, 1, 2, \ldots 2^n-1\}$. In the illustrated embodiment, for example, the first mapping table 232 maps a binary "−1" value in the differential detection signal 136 to "0" and maps a binary "1" value in the differential detection signal 136 to $2^n-1$. In the illustrated embodiment, the second mapping table 234 maps a binary "−1" value the in differential detection signal 136 to $2^{n-2}$ and maps a binary "1" value in the differential detection signal 136 to $2^n-1-2^{n-2}$. As an example, if a 2-bit soft-decoding FEC decoder is used, the mapping in the first mapping table 232 is −1 to 0 and 1 to 3 and the mapping in the second table 234 is −1 to 1 and 1 to 2. FIG. 3 shows a table illustrating, in a 2-bit system, one example of the output of a differential detector (i.e., the differential detection signal 136) together with an output of the logic circuit 220 and the soft decision signal 236.

The use of soft information in the FEC decoding may improve the system performance, for example, by about 0.5 to 1.2 dB compared to a hard-decision DPSK system. One example of a soft decision FEC decoding system using a 2-bit soft TPC decoder at $10^{-5}$ output bit error rate (BER) is capable of a 0.8 dB gain in Q-factor over a simple hard decision differential detection DPSK system.

Figures 4, 5:
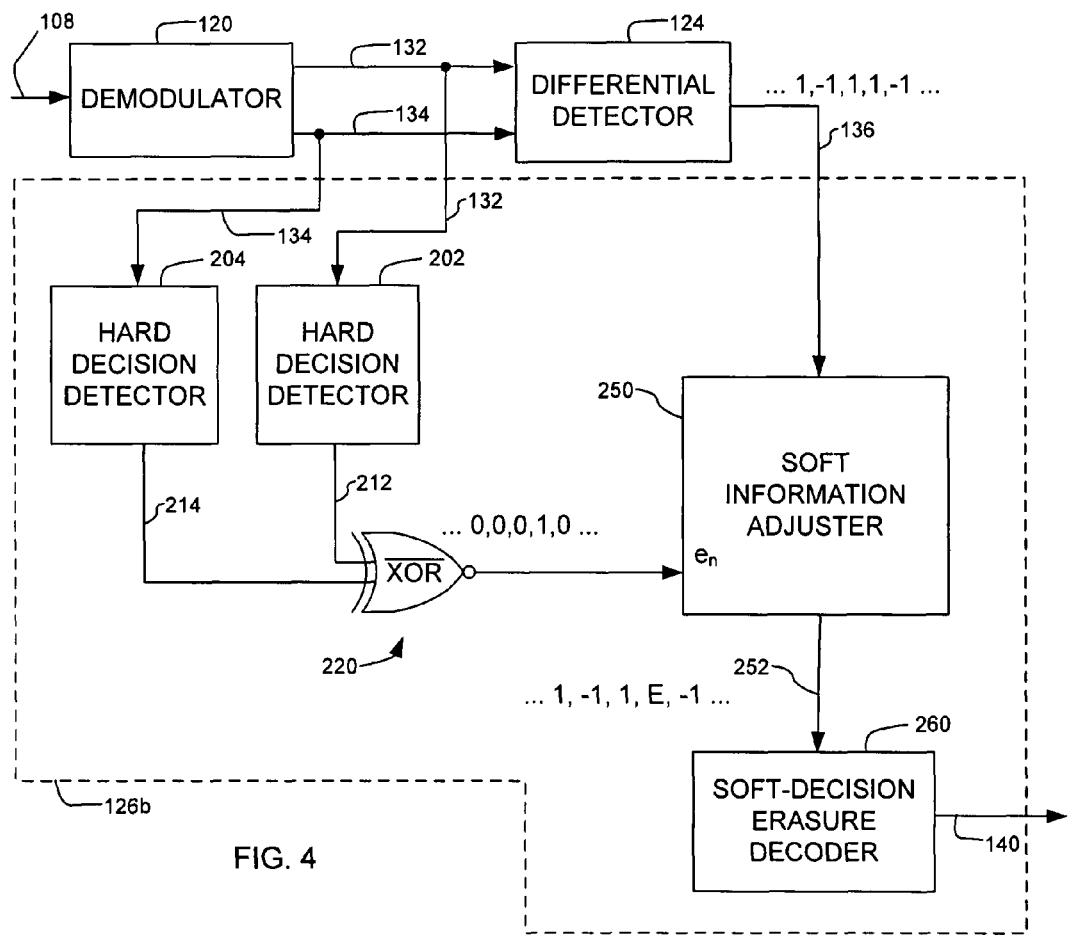
FIG. 4 is a schematic block diagram of another embodiment of a soft information FEC decoding system using erasures.
FIG. 5 is a table illustrating one example of the values of a differential detection signal and the corresponding values of an error locating signal and soft decision signal.

FIG. 4 shows another embodiment of the soft information FEC decoding system 126b that is capable of three (3) decision level erasure decoding. This embodiment of the FEC decoding system 126b includes the hard decision detectors 202, 204 and logic circuit 220, as described above. Instead of using mapping tables, this embodiment of the FEC decoding system 126b includes a soft information adjuster 250 that adjusts the differential detection signal 136 by replacing a value that is in doubt with an erasure. The error locating signal 222 indicates the bit position of the value that is in doubt in the differential detection signal 136. The adjustment of the differential detection signal 136 by replacing values in doubt with erasures produces the soft decision signal 252.

The soft decision signal 252 may be fed to a soft decision erasure decoder 260, which decodes the signal using erasure decoding techniques known to those skilled in the art. For an FEC code with minimum Hamming distance of $d_{min}$, the error (e) and erasure (f) correction capability may be expressed as $(2e+f)<d_{min}$. In this decoding scheme, two erasures count for one error. Thus, the erasure decoding may help to improve system performance. FIG. 5 shows a table illustrating one example of the output of a differential detector (i.e., the differential detection signal 136) together with an output of the logic circuit 220 and the soft decision signal 252.

In summary, a receiver consistent with one embodiment of the present invention receives a modulated signal containing a forward error correction (FEC) encoded data stream. The receiver includes a demodulator to receive the modulated signal and to demodulate the modulated signal to produce a constructive signal and a destructive signal. A differential detector receives the constructive and destructive signals and produces a hard decision differential detection signal corresponding to the FEC encoded data stream. A soft decision FEC decoding system receives the constructive and destructive signals and the differential detection signal. The error correction decoding system determines a possible error in the differential detection signal using hard-decision detection of each of the constructive and destructive signals. The decoding system converts the differential detection signal into a soft decision signal including multi-level soft values and decodes the soft decision signal.

According to another embodiment, a forward error correction (FEC) decoding system includes first and second hard decision detectors to receive the constructive and destructive signals, respectively, and to produce an error locating signal indicating possible errors in the hard decision differential detection signal. The error locating signal is used to select one of first and second mapping tables, which maps multi-level soft values to the hard decision differential detection signal. A soft decision decoder decodes the multi-level soft values mapped to the hard decision differential detection signal.

According to a further embodiment, a forward error correction (FEC) decoding system includes a soft information adjuster to replace at least one value in the hard decision differential detection signal with an erasure when the error locating signal indicates that the at least one value is a possible error, thereby producing an adjusted differential detection signal. An erasure decoder decodes the adjusted differential detection signal.

According to yet another embodiment, a method of forward error correction (FEC) decoding comprises: receiving a modulated FEC encoded signal containing a FEC encoded data stream; demodulating the modulated FEC encoded signal to produce a constructive signal and a destructive signal; differential detecting the constructive signal and the destructive signal to produce a hard decision differential detection signal corresponding to the FEC encoded data stream; detecting each of the constructive signal and the destructive signal to produce an error locating signal indicating possible errors in the differential detection signal; converting the hard decision differential detection signal into a soft decision signal using the error locating signal; and decoding the soft decision signal to produce an output data stream.

Accordingly, the system and method of FEC decoding using soft information is capable of improving the detection and correction of bit errors in digital signals, particularly in a DPSK system or similar system.

Other systems, methods, features, and advantages of the inventions will be or will become apparent to one of ordinary skill in the art upon examination of the drawings and detailed description. It should be emphasized that the above-described embodiments are merely possible examples of implementations set forth by way of illustration but not by way of limitation. Many variations and modifications may be made to the above-described embodiments without departing substantially from the spirit and principles of the inventions. All such modifications and variations are intended to be included herein within the scope of this disclosure of the inventions and are intended to be protected by the following claims.

What is claimed is:

1. A method of forward error correction (FEC) decoding, said method comprising:

receiving a modulated FEC encoded signal containing a FEC encoded data stream;

demodulating the modulated FEC encoded signal to produce a constructive signal and a destructive signal, said constructive signal being the result of splitting and constructively recombining said modulated FEC encoded signal and said destructive signal being the result of splitting and destructively recombining said modulated FEC encoded signal;

differentially detecting said constructive signal and said destructive signal to produce a hard decision differential detection signal corresponding to said FEC encoded data stream;

producing an error locating signal indicating possible errors in said differential detection signal using a hard-decision detection of said constructive signal to produce a first binary signal and a hard decision detection of said destructive signal to produces a second binary signal and comparing said first binary signal and said second binary signal using a logic circuit;

converting said hard decision differential detection signal into a soft decision signal using said error locating signal, said soft decision signal including multi-level soft values; and decoding said soft decision signal to produce an output data stream.

2. The method of claim 1, wherein said modulated FEC encoded signal is modulated using DPSK format.

3. The method of claim 1, wherein converting said differential detection signal into said soft decision signal includes mapping hard decision values in said differential detection signal to multi-level soft values.

4. The method of claim 3 further comprising selecting one of a plurality of mapping tables based on said error locating signal.

5. The method of claim 1 wherein converting said differential detection signal into said soft decision signal includes replacing at least one value in said differential detection signal with an erasure, wherein said error locating signal indicates said at least one value to be replaced.

6. The method of claim 1, wherein said demodulating comprises producing said constructive and destructive signals using an optical delay interferometer.

7. The method of claim 6, wherein said optical delay interferometer comprises a Mach-Zehnder interferometer.

8. The method of claim 1, wherein said logic circuit comprises an inverted exclusive OR logic circuit.

* * * * *